(12) United States Patent
Ditto

(10) Patent No.: US 9,202,739 B2
(45) Date of Patent: Dec. 1, 2015

(54) HOLDER FOR SEMICONDUCTOR WAFERS AND FLAT SUBSTRATES

(71) Applicant: BOT Research, LLC, Eugene, OR (US)

(72) Inventor: Jeffrey J. Ditto, Eugene, OR (US)

(73) Assignee: BOT Research, LLC, Eugene, OR (US)

( * ) Notice: Subject to any disclaimer, the term of this patent is extended or adjusted under 35 U.S.C. 154(b) by 0 days.

(21) Appl. No.: 14/539,953

(22) Filed: Nov. 12, 2014

(65) Prior Publication Data

US 2015/0069200 A1 Mar. 12, 2015

Related U.S. Application Data

(63) Continuation of application No. 13/624,863, filed on Sep. 21, 2012, now abandoned.

(60) Provisional application No. 61/537,903, filed on Sep. 22, 2011.

(51) Int. Cl.
*F16M 13/00* (2006.01)
*H01L 21/687* (2006.01)
*H01L 21/67* (2006.01)
*H01L 21/677* (2006.01)
*H01R 13/187* (2006.01)

(52) U.S. Cl.
CPC .... *H01L 21/68721* (2013.01); *H01L 21/67178* (2013.01); *H01L 21/67766* (2013.01); *H01L 21/67769* (2013.01); *H01L 21/68707* (2013.01); *H01R 13/187* (2013.01)

(58) Field of Classification Search
CPC ............... H01L 21/68721; H01L 21/67178; H01L 21/67766; H01L 21/67769; H01L 21/68707; H01R 13/187
See application file for complete search history.

(56) References Cited

U.S. PATENT DOCUMENTS

| 4,416,497 | A | 11/1983 | Brandsness et al. | |
|---|---|---|---|---|
| 4,903,402 | A | 2/1990 | Norton et al. | |
| 6,227,869 | B1 | 5/2001 | Lin et al. | |
| 6,872,082 | B2 | 3/2005 | Hsu et al. | |
| 7,275,936 | B1 | 10/2007 | Ju | |
| 7,767,979 | B2 | 8/2010 | Donna | |
| 7,791,443 | B1 | 9/2010 | Ju | |
| 8,011,259 | B2 | 9/2011 | Donna | |
| 8,998,657 | B1* | 4/2015 | Von Eckroth | H01R 13/14 439/810 |
| 2002/0177394 | A1 | 11/2002 | Hollatz et al. | |
| 2003/0060090 | A1* | 3/2003 | Allgood | H01R 11/289 439/845 |
| 2005/0277336 | A1* | 12/2005 | Yang | H01R 13/187 439/636 |
| 2006/0035483 | A1 | 2/2006 | Rathburn et al. | |
| 2012/0108113 | A1* | 5/2012 | Yamaguchi | H01R 13/187 439/842 |

\* cited by examiner

*Primary Examiner* — Amy Sterling
(74) *Attorney, Agent, or Firm* — Lumen Patent Firm

(57) ABSTRACT

A holder for a flat substrate, such as for example a semiconductor wafer or a glass slide, has a fixture with a sample insertion groove for holding the flat substrate, or multiple sample insertion grooves for holding multiple flat substrates. The fixture also has a channel milled perpendicular to the sample insertion groove. The channel may be machined such that two portions of the channel open to opposite sides of the fixture. Positioned in the channel of the fixture is a cantilever spring for securing the flat substrate in the sample insertion groove. The channel may contain a single cantilever spring that extends an entire length of the channel, or multiple cantilever springs. The fixture may include a post, dove tail, screw, or clamp for mounting the holder on a stage inside a vacuum chamber of an instrument.

1 Claim, 16 Drawing Sheets

Fig. 3A
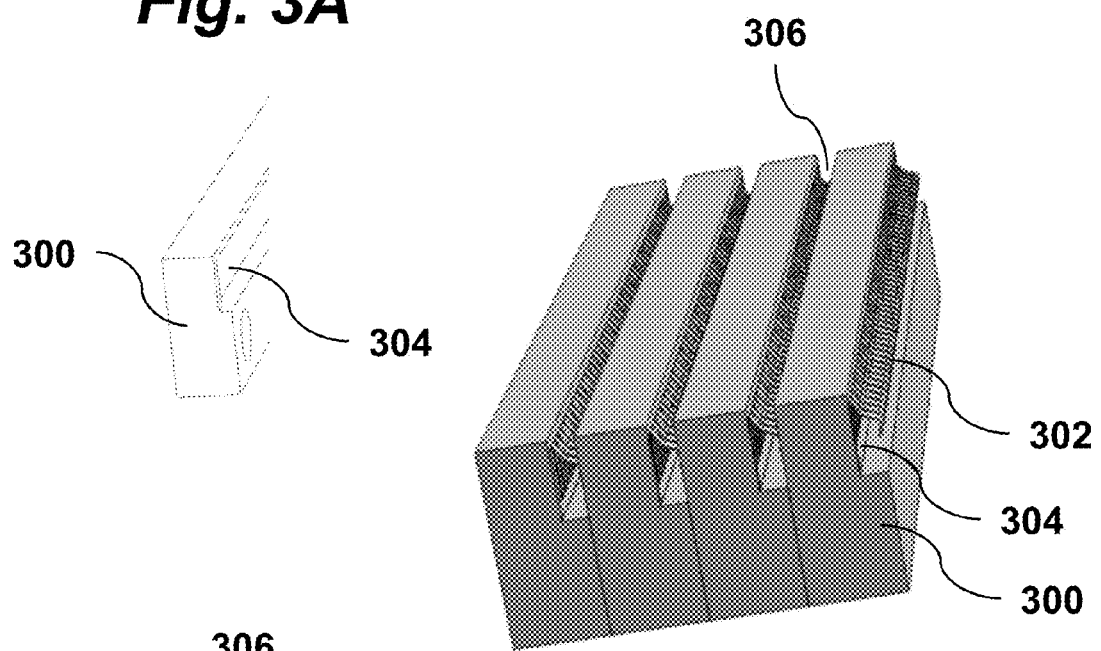
Fig. 3B
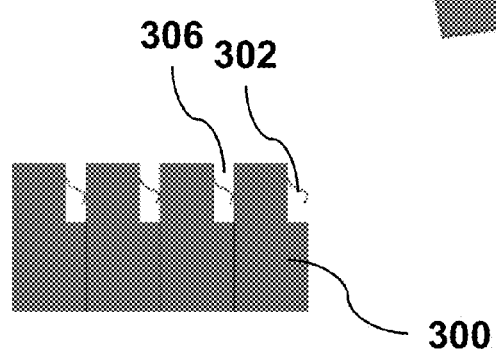
Fig. 3C

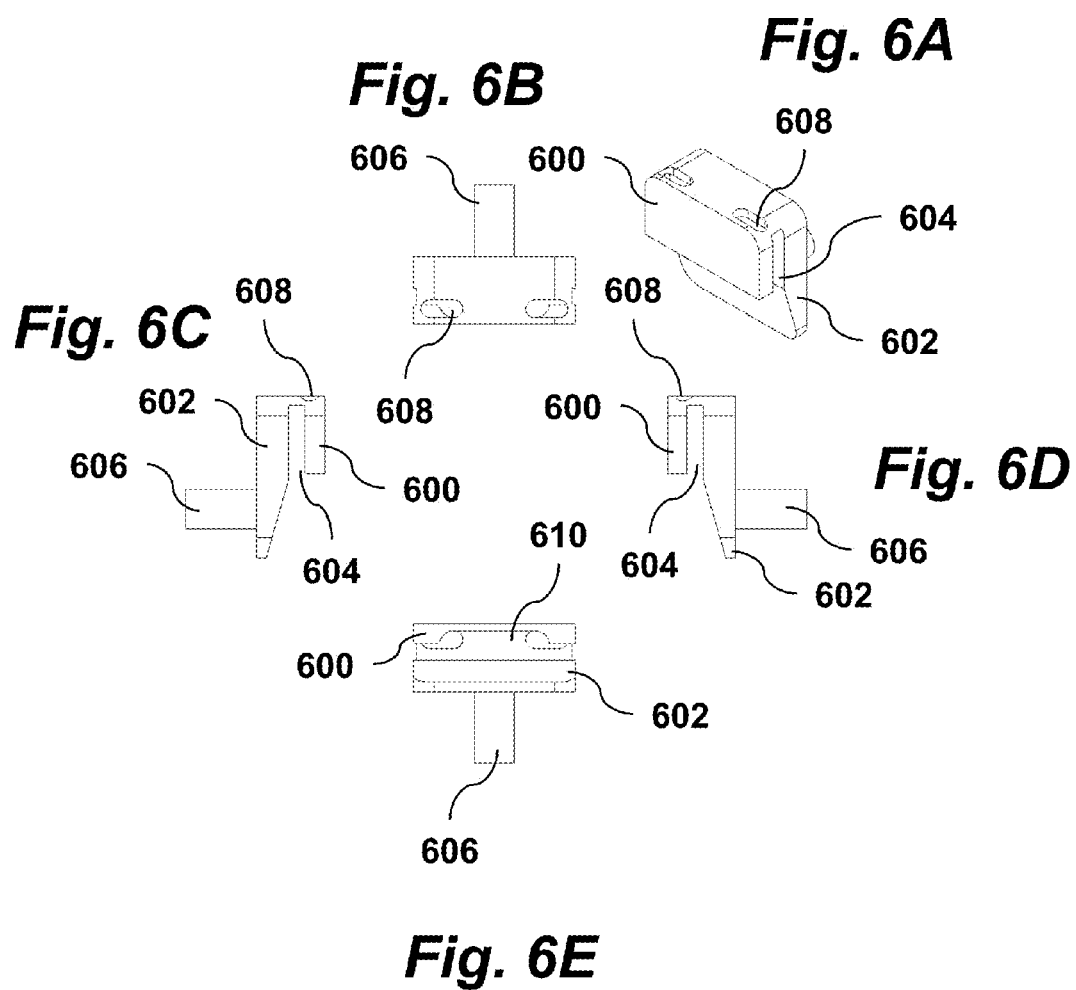

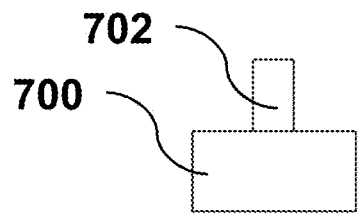
Fig. 7A
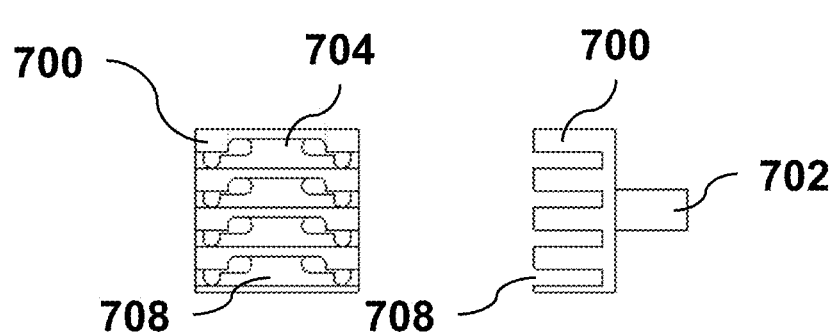
Fig. 7B     Fig. 7C
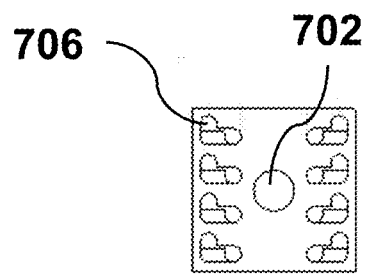
Fig. 7D

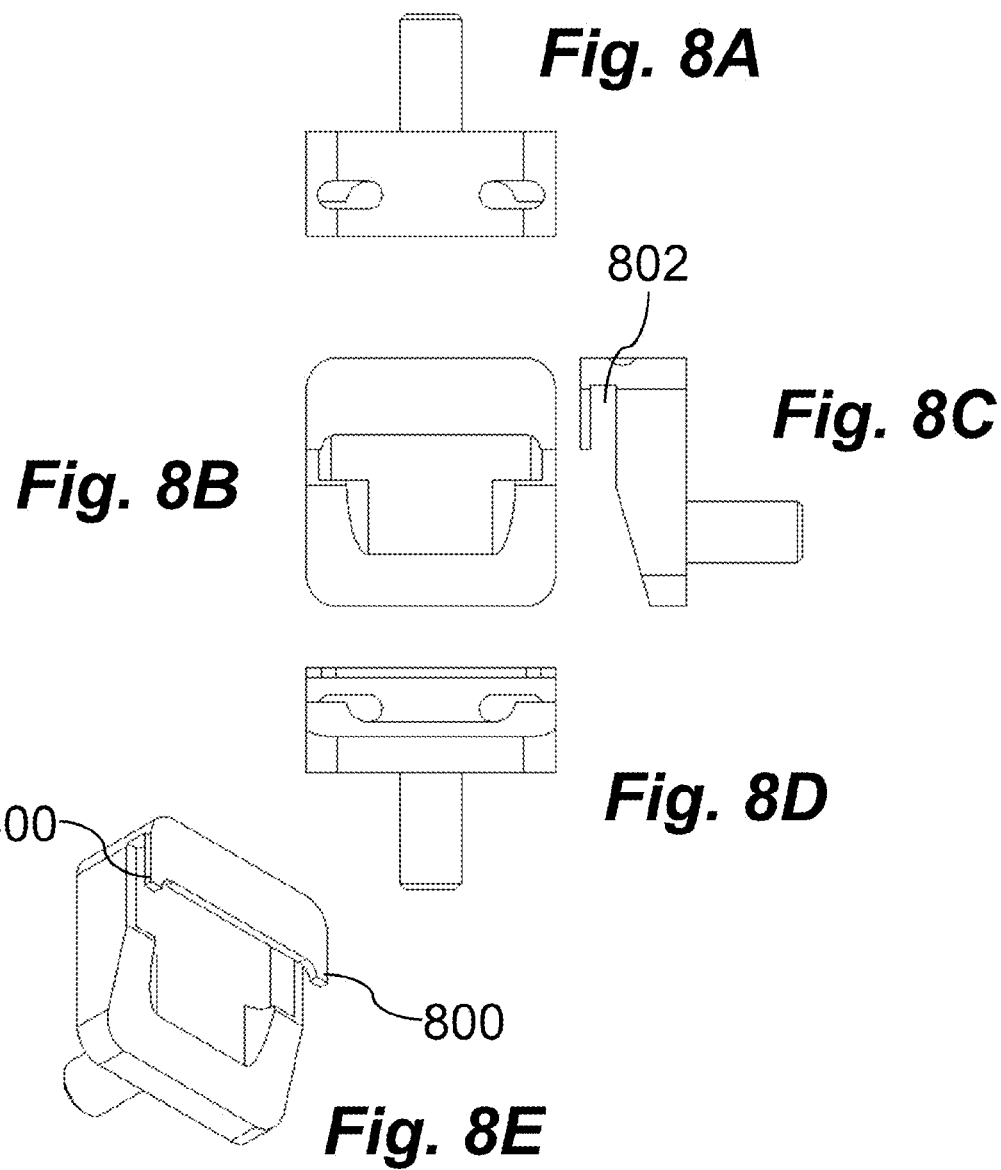

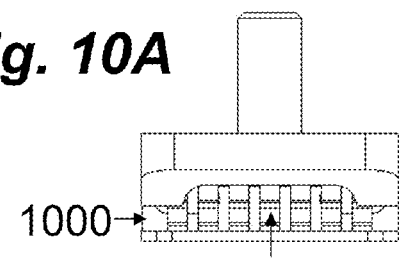
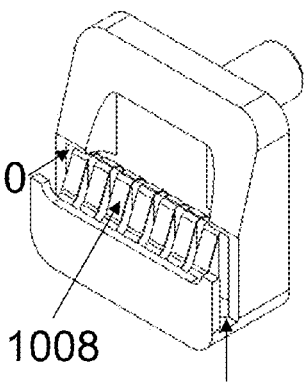
Fig. 10B
Fig. 10A
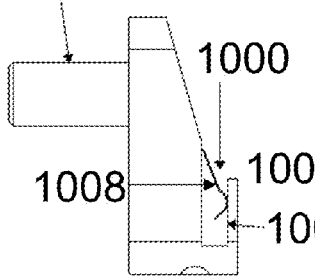
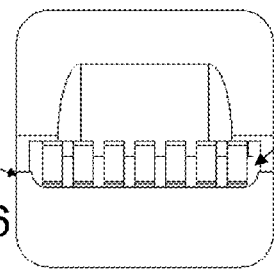
Fig. 10C
Fig. 10D
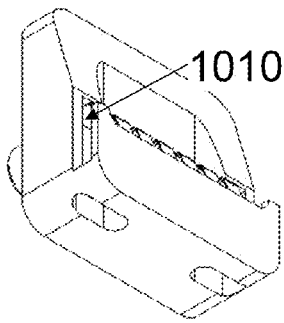
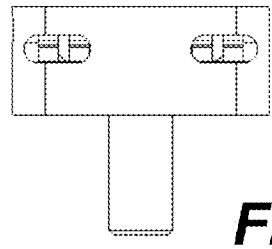
Fig. 10F
Fig. 10E

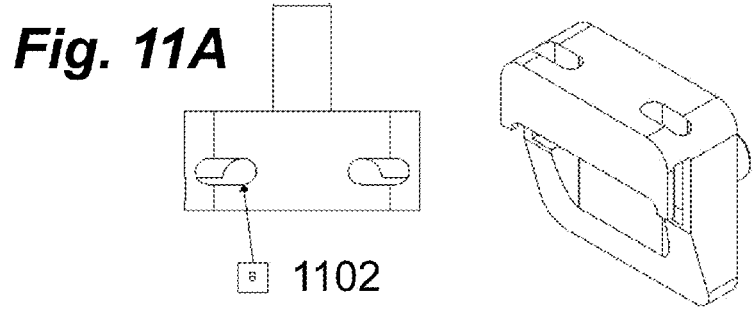
Fig. 11A
Fig. 11B
1102
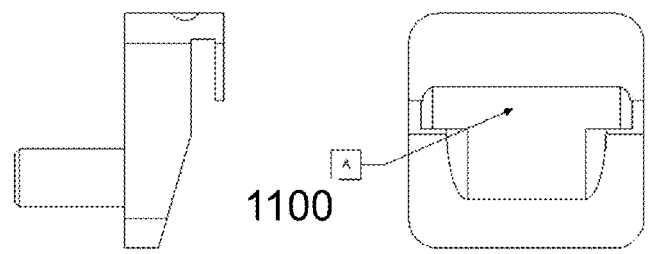
Fig. 11C
1100
Fig. 11D
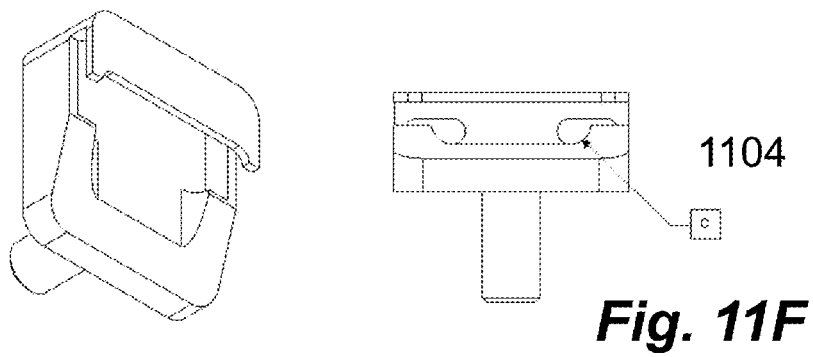
1104
Fig. 11E
Fig. 11F

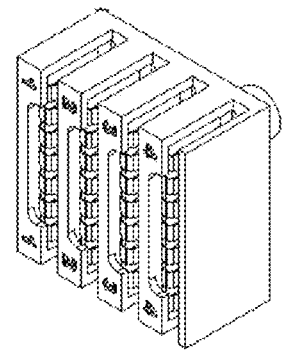
Fig. 12A
Fig. 12B
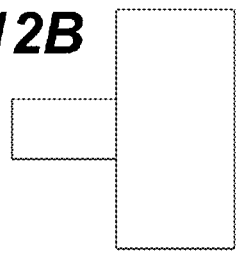
Fig. 12C
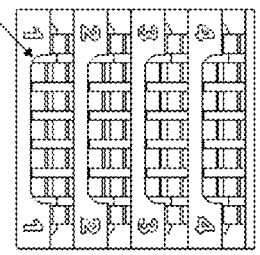
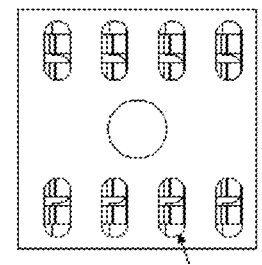
Fig. 12D
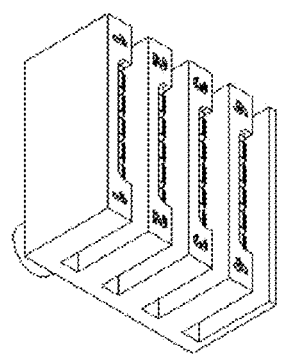
Fig. 12F
Fig. 12E

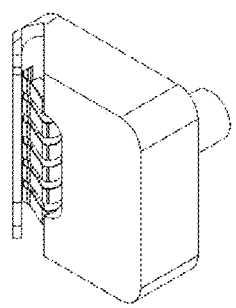
Fig. 13A
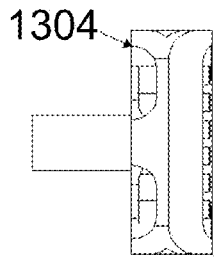
Fig. 13B
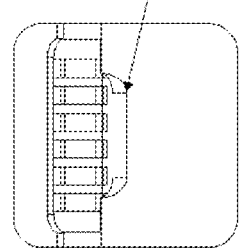
Fig. 13C
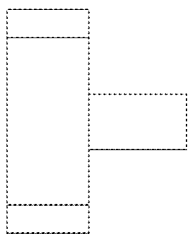
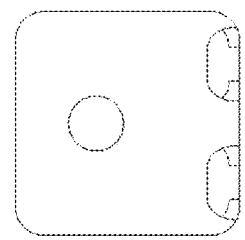
Fig. 13D    Fig. 13E
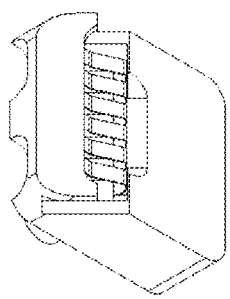
Fig. 13F
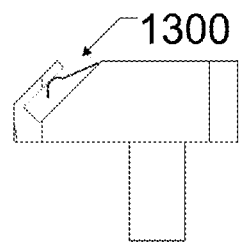
Fig. 13G

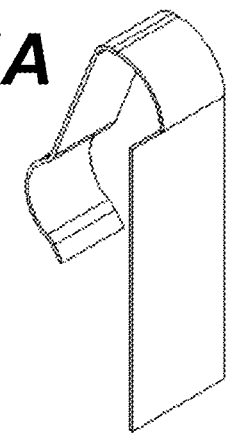
Fig. 14A
Fig. 14B
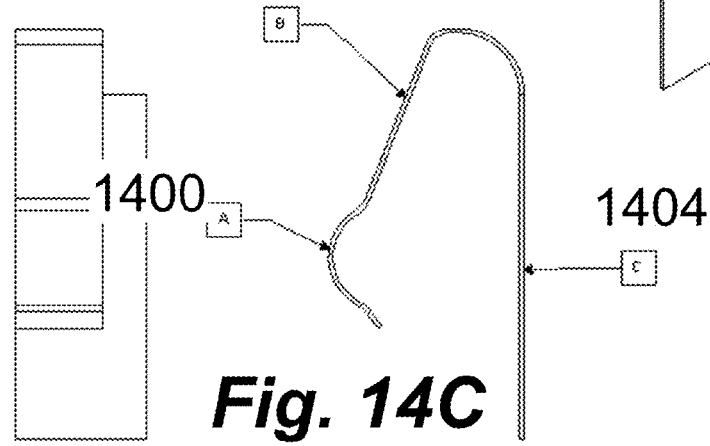
Fig. 14C
Fig. 14D
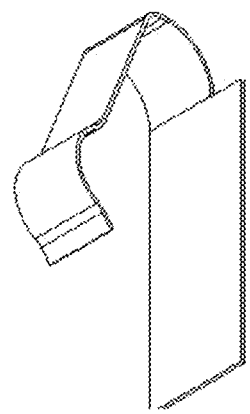
Fig. 14E

Fig. 15A
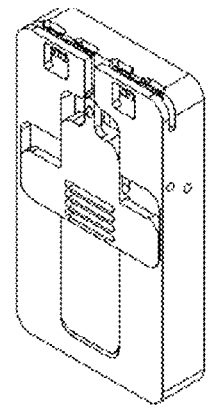
Fig. 15B  Fig. 15C
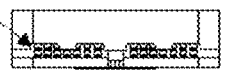
1502
1500
1504
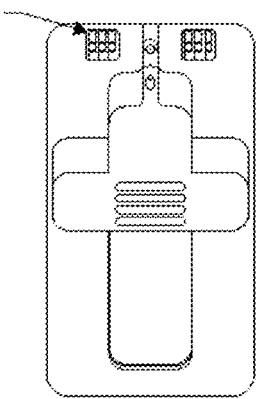
Fig. 15D
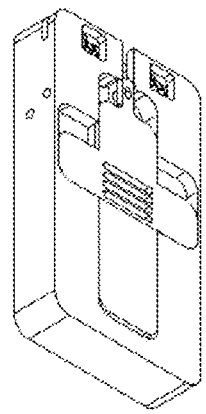
Fig. 15E

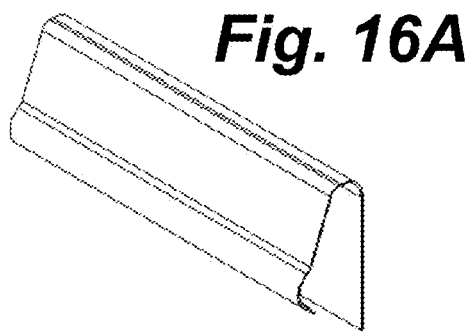
Fig. 16A
Fig. 16B
Fig. 16C
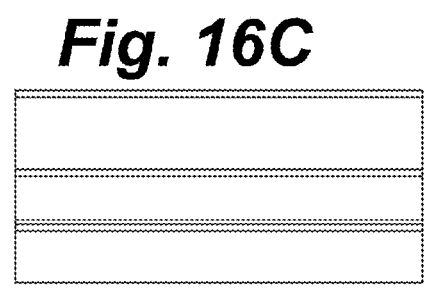
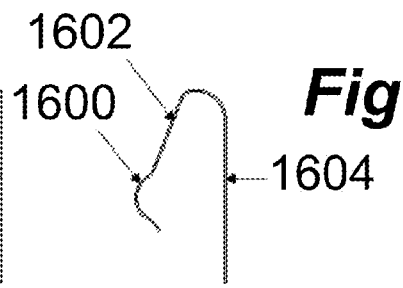
Fig. 16D
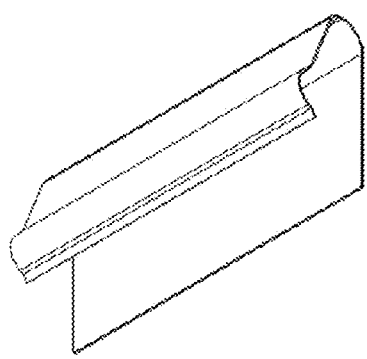
Fig. 16E

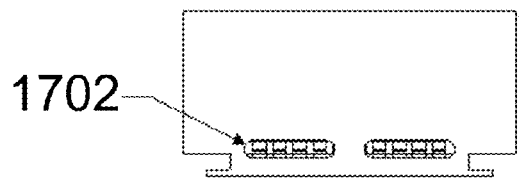
*Fig. 17A*
*Fig. 17B*
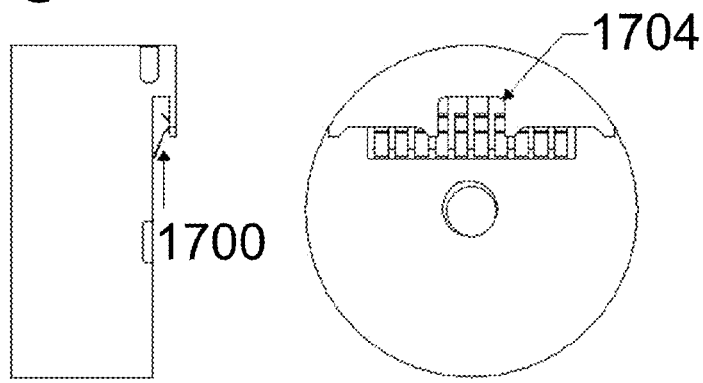
*Fig. 17C*
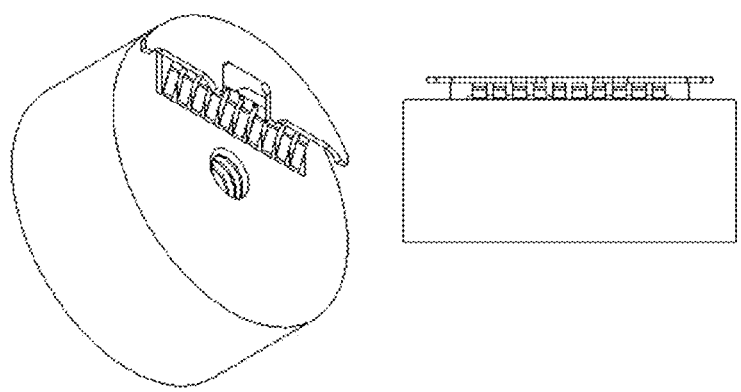
*Fig. 17E*
*Fig. 17D*

HOLDER FOR SEMICONDUCTOR WAFERS AND FLAT SUBSTRATES

CROSS-REFERENCE TO RELATED APPLICATIONS

This application is a continuation of U.S. patent application Ser. No. 13/624,863 filed Sep. 21, 2012, which claims priority from U.S. Provisional Patent Application 61/537,903 filed Sep. 22, 2011, both of which are incorporated herein by reference.

FIELD OF THE INVENTION

The present invention relates generally to devices for holding flat substrates, such as semiconductor wafers. More specifically, it relates to such holders specially suited for sample mounting in vacuum chamber instruments.

BACKGROUND OF THE INVENTION

Instruments such as scanning electron microscopes, focused ion beam instruments, x-ray photoelectron spectrometers, and time-of-flight secondary ion mass spectrometers are often useful to researchers and technicians in the field of materials science and the semiconductor industries. In these instruments, wafers composed of silicon, gallium arsenide, indium phosphate, quartz, silica, germanium or sapphire (to name a few) are processed and/or analyzed for use as a substrate for electrical devices and thin films. These instruments are normally equipped with a stage for mounting a sample holder that holds the wafer or other flat substrate in place. Different sample holding mechanisms are known for use in these charged particle beam imaging and compositional analysis instruments due to the significant role they play in producing high quality data. Existing sample holders are limited in various ways, however. For example, instrument suppliers commonly provide a flat surface for gluing or taping the sample to the sample stage, but these methods are often unreliable and have other undesirable effects in precision instrumentation. The available mechanical clamping mechanisms tend to be large, challenging to use, and accommodate a small number of samples. Accordingly, there is a need for improved sample holders for such applications.

SUMMARY OF THE INVENTION

In one aspect, the present invention provides a holder for a flat substrate, such as for example a semiconductor wafer or a glass slide. The holder has a fixture composed of a nonmagnetic material such as for example brass, aluminum, titanium, stainless steel, or copper. The fixture is preferably a milled solid piece of metal, but may alternatively be composed of two or more milled solid pieces of metal held together with screws. The fixture has a sample insertion groove for holding the flat substrate, or multiple sample insertion grooves for holding multiple flat substrates. The fixture also has a channel milled perpendicular to the sample insertion groove. The channel may be machined such that two portions of the channel open to opposite sides of the fixture.

Positioned in the channel of the fixture is a cantilever spring for securing the flat substrate in the sample insertion groove. The channel may contain a single cantilever spring that extends an entire length of the channel, or multiple cantilever springs. The cantilever spring may be held in place only by its own compression against opposing surfaces of the channel, or it may be held in place by screws, glue, or a clamp. The cantilever spring is preferably composed of beryllium copper or other EMI shielding gasket material.

The fixture may include a post, dove tail, screw, or clamp for mounting the holder on a stage inside a vacuum chamber of an instrument, preferably such that the orientation of the substrate with respect to the stage is 0-degrees, 45-degrees, or 90-degrees.

The holder may include a second fixture that has a second sample insertion groove and a second channel milled perpendicular to the second sample insertion groove, and a movable post positioned between the fixture and second fixture for cleaving the flat substrate.

BRIEF DESCRIPTION OF THE DRAWINGS

FIGS. 3A-C show three views of a vertical substrate holder, according to an embodiment of the invention.

FIGS. 6A-E show five views of a horizontal substrate holder, according to an embodiment of the invention.

FIGS. 7A-D show four views of a vertical substrate holder, according to an embodiment of the invention.

FIGS. 8A-E show five views of a horizontal substrate holder, according to an embodiment of the invention.

FIGS. 10A-F show six views of a horizontal substrate holder, according to an embodiment of the invention.

FIGS. 11A-F show six views of a horizontal substrate holder, according to an embodiment of the invention.

FIGS. 12A-F show six views of a vertical substrate holder, according to an embodiment of the invention.

FIGS. 13A-G show seven views of a 45-degree substrate holder, according to an embodiment of the invention.

FIGS. 14A-E show five views of a spring used as part of a substrate holder, according to an embodiment of the invention.

FIGS. 15A-E show five views of a cleaving device incorporating a substrate holder, according to an embodiment of the invention.

FIGS. 16A-E show five views of a spring used as part of a substrate holder, according to an embodiment of the invention.

FIGS. 17A-E show five views of a substrate holder, according to an embodiment of the invention.

DETAILED DESCRIPTION

Embodiments of the present invention provide a versatile compression mode cantilever spring flat substrate holder for focused charged particle beam imaging and compositional analysis instruments. The wafer or flat substrate sample holder allows quick and stable sample mounting for limited space vacuum chambers especially useful for the scanning electron microscope, focused ion beam instruments, and instruments used for compositional analysis such as x-ray photoelectron spectrometers (XPS) and time-of-flight secondary ion mass spectrometers (Tof-SIMS). The holder allows researchers and technicians to slide the sample into an unobtrusive groove without the use of tape, adhesive or set screws.

Embodiments of the present invention have significant advantages when compared to currently available holders. These include the following: The sample holder is low profile, allowing for efficient sample loading and increased throughput cutting the cost of data acquisition by avoiding extra sample exchanges. The sample holder can be used in different orientations and allow for numerous experiment types. The sample holder allows samples to be safely mounted in close proximity to sensitive instrumental parts without the risk of bulky mechanisms colliding with the instrument. Regular use of the holder could greatly reduce the partial pressure of carbon molecules in high vacuum chamber caused by adhesives or tapes which can outgas carbon molecules. The sample holder allows much faster methods than currently available methods which typically require waiting for adhesives to dry or the tedium of screws and tape. The sample holder provides a stable hold which avoids the mechanical drift that often takes place when using adhesives and favors higher resolution imaging. The sample holder makes good electrical contact with the sample which reduces charging effects in charged particle instruments. The holder is useful for thin samples such as solar cells which can break when trying to mount and dismount from adhesives. In the horizontal mounting mode the sample holder uses back surface spring compression which provides a fixed working distance from the instrument for samples of different thicknesses. Having a fixed working distance regardless of sample thickness makes the holder well suited for in situ transmission electron microscope (TEM) preparation and could be outfitted with a TEM grid holder for mounting in situ lift out samples.

Figure 1:
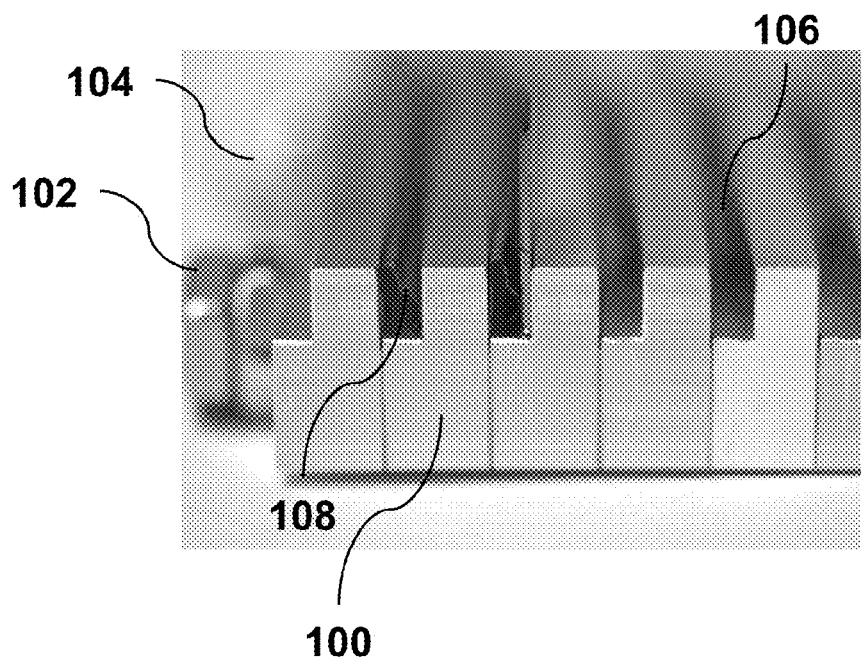
FIGS. 1-2 show two views of a vertical substrate holder, according to an embodiment of the invention.
Figure 2:
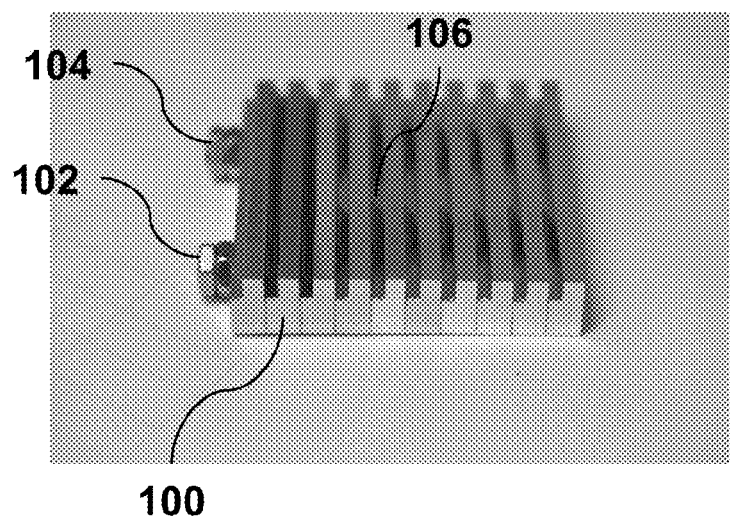

FIGS. 1 and 2 show two views of an embodiment of the invention designed for holding multiple samples in cross-section. Cross-sectional analysis requires samples to be held parallel to the instrument source exposing the cross-section for data acquisition. The holder shown in FIGS. 1 and 2 has multiple fixtures, such as fixture 100, held together by bolts 102 and 104. Each fixture 100 is manufactured from nonmagnetic materials such as brass and/or aluminum. The fixtures are machined to create grooves, such as groove 106, to hold the flat substrates. Cantilever springs such as spring 108 rest in the groove for securing the sample in the fixed groove. The springs in this embodiment are designed such that adjacent fixtures of the holder are used to pinch the bottom of the spring. Preferably, spring 108 is an EMI shielding gasket spring which provides a compact design and allows mounting of many more samples in the vacuum chamber for cross-sectional analysis. In a preferred embodiment, the electromagnetic interference (EMI) shielding gasket spring is composed of beryllium copper. In contrast with standard cross-section holders which only allow users to mount one or a few samples. The design shown is extendable and can hold dozens of samples while remaining a reasonable size for the vacuum chamber.

FIGS. 3A-C illustrate several views of an alternate embodiment of the invention, similar to the embodiment shown in FIGS. 1-2. In the embodiment shown in FIGS. 3A-C, the way the spring is held in place has a different design. A channel 304 is milled perpendicular to the sample insertion groove 306 in the fixture 300. The cantilever spring 302 rests in the channel 304 and is held in place only by its own compression against the opposing surface to the channel on the opposite side of the groove 306. This design can be used in the cross-section holder by placing a channel 304 in each individual fixture of the cross-section holder. The holder is shown here as four separate pieces but the holder can be manufactured out of a solid piece of metal and can be sized with any number of channels. From the side view it can be observed that the holder sample insertion groove is sized to allow the spring to hold itself in the channel.

Figure 4:
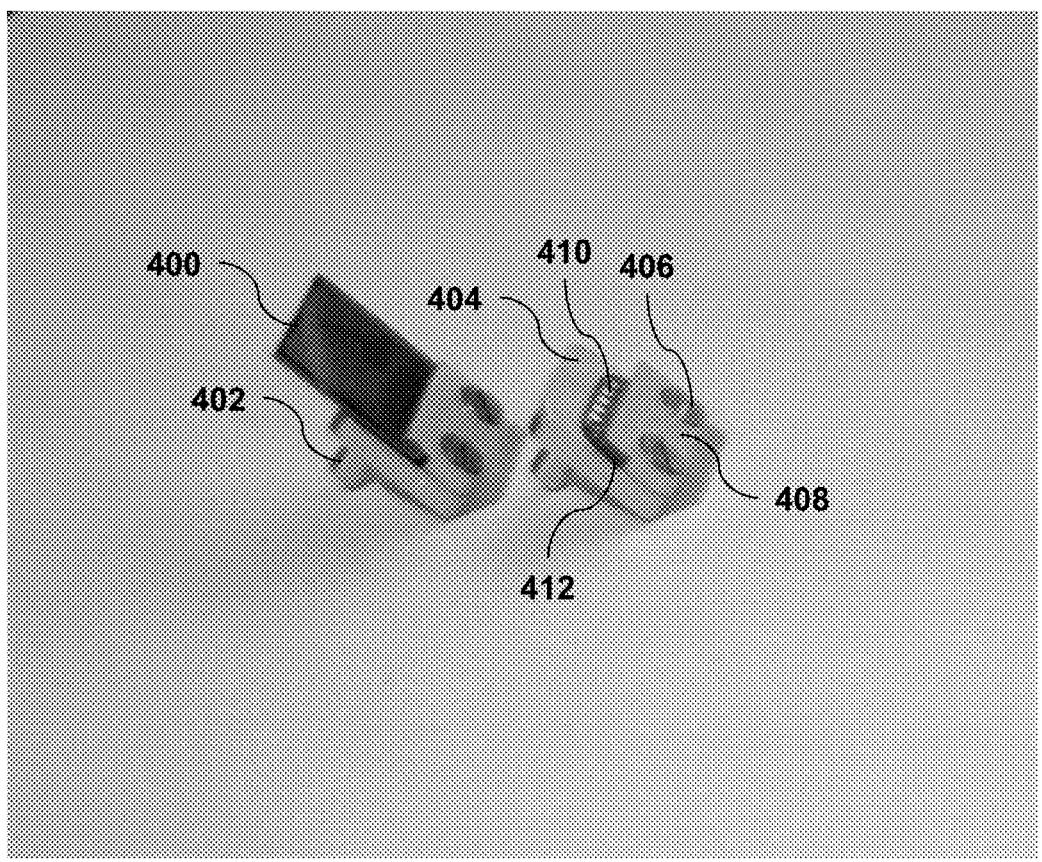
FIG. 4 is a view of two horizontal substrate holders, with and without a substrate, according to an embodiment of the invention.

FIG. 4 illustrates an embodiment designed to hold flat substrates and wafers for examination of their top surface. In this embodiment cantilever springs 410 push up on the backside of the sample 400 and hold the sample against the flat surface of a top half 408 of the fixture above. It is the surface above the sample 400 which dictates the angle of the sample in the holder. A bottom half 404 of the fixture is attached to the top half 408 with two screws 406 and has a channel in which springs 410 are positioned. The bottom half 404 of the fixture also has a post 402 for mounting the holder in a standard stage. Because this holder is used for surface analysis, it is designed to provide optimal viewable area on the wafer. The top half 408 of the fixture has a groove 412 for holding the sample 400, and a portion of the top half 408 above the wafer covers the wafer 400 to the point where the springs 410 are pushing from the back side.

Figure 5A:
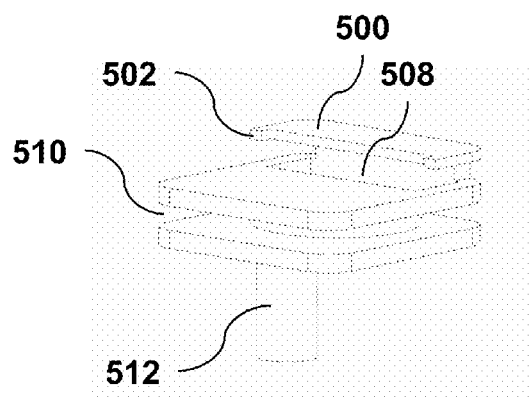
FIGS. 5A-C show three views of a horizontal substrate holder, according to an embodiment of the invention.
Figure 5B:
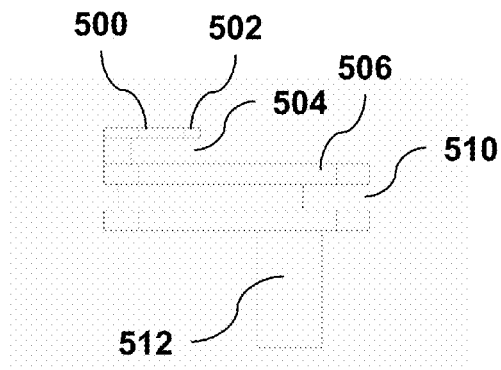
Figure 5C:
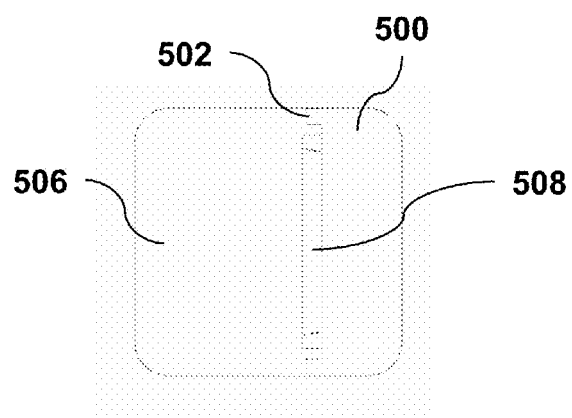
Figure 9A:
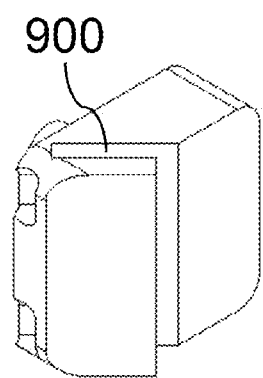
FIGS. 9A-E show five views of a 45-degree substrate holder, according to an embodiment of the invention.
Figure 9B:
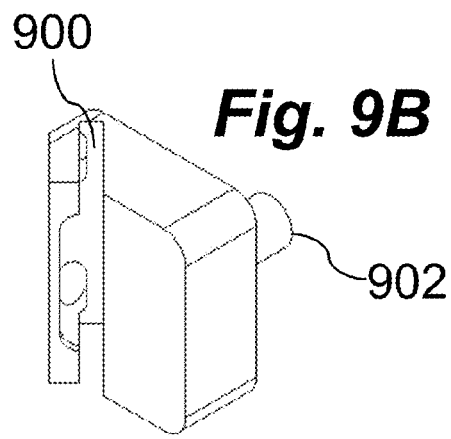
Figure 9C:
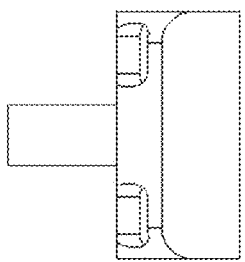
Figure 9D:
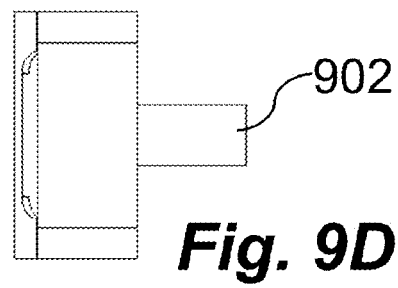
Figure 9E:
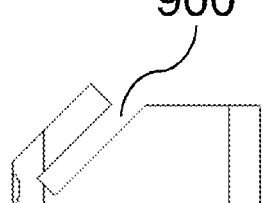

An alternate embodiment of a horizontal holder is shown in FIGS. 5A-C. The fixture of this holder has a top portion 500 with small guides 502 on the fixture extend beyond the push point of the springs (not shown). These guides 502 help when inserting samples into the groove 504 of the holder without blocking much of the upper surface of the sample. Using guides 502 covers less surface area on the top surface of the sample. The fixture has a bottom portion 506 which includes a channel 508 for containing the springs. To make smaller fixtures easier to handle, grooves 510 in the fixture allow standard tweezers and specimen mount grippers to handle the fixtures. The post 512 is included on the underside of the fixture and is useful for inserting the sample into standard stages. The post can be replaced to allow use in different styles of instrument stages. The holders could be modified to accommodate the different mounting mechanisms for specimen holders specific to the instrument in use.

Note that a cross-section (90 degree) holder and a surface (0 degree) holder are not the only possibilities. These holders may be adapted to work well for all angles in between. For experiments such as electron backscatter diffraction samples are held at 70 degrees and many electron microscope users prefer to use 45 degree holders. All these angles can be easily accommodated by simple alterations in the embodiments of the present invention. Moreover, putting the holder on an adjustable hinge could allow it to hold samples at any angle.

For samples with very rough top surfaces, this holder could be modified to hold substrates from the top side by mounting the spring mechanism in a channel machined into the top portion 500 above the sample for non-cross-section holders. This still allows for the same conductive and secure hold without the prerequisite of the sample having a smooth top surface. Additionally, alternate embodiments may include an adjustable groove using a set screw, spring, or clamp in order to provide a variable thickness groove 504 to accommodate samples of a wide range of thicknesses.

FIGS. 6A-E show an embodiment of a horizontal sample holder whose fixture is machined from a single monolithic piece of metal. The fixture has a top portion 600 and bottom portion 602 with a groove 604 machined between them for inserting a sample. The fixture also includes a post 606. A channel for holding the springs is machined such that two portions of the channel open to opposite sides of the fixture. Specifically, openings 608 in the back and 610 in the front are used to machine the channel into the groove 604.

FIGS. 7A-D show several views of a cross-section holder having multiple grooves 708 that could accommodate mounting many samples at once. Like the holder of FIG. 6, the fixture is also machined of a single piece of metal and is composed of a post 702 and several pieces 700 between which are machined the grooves 708. The channels for holding the springs (not shown) are machined such that two portions of the channel open to opposite sides of the fixture. Specifically, openings 704 in the front and 706 in the back are used to machine the channel into the groove.

FIGS. 8A-E show views of a horizontal holder similar to that shown in FIGS. 6A-E. Like the embodiment of FIGS. 6A-E, the fixture is machined from a single solid piece of metal. Like FIGS. 5A-C, it includes guides 800 to help with sample insertion into the groove 802.

FIGS. 9A-E show views of a 45-degree holder. It is similar in design to the horizontal holders of FIGS. 5A-C, 6A-E, 8A-E but has the groove 900 machined at a 45-degree angle to the post 902 instead of a 90-degree angle.

FIGS. 10A-F show several views of a horizontal sample holder. A slot 1000 is provided for inserting and holding flat substrates. Guides 1002 form small extensions of the upper fixture that reach past the spring's point of contact with the sample to guide insertion of the sample into the groove 1000. If the sample is past the guides prior to making contact with the springs 1008 in channel 1010 it assists the user by requiring them only to push the sample straight into the slot. Without the guides users must compress the springs with the sample while it is being inserted. A post 1004 is provided for mounting the holder in a stage. Holders can be adapted for many instruments and stages. For many electron microscopes, a hole with a set-screw is used to hold the sample holders. Other mounting options could replace the post shown in this drawing. The surface of the fixture opposing the springs, indicated by 1006, determines the projection of the sample out of the holder.

If this surface is precisely machined, the sample will continue at that angle as it extends out of the slot.

FIGS. 11A-F show several views of a horizontal sample holder. Channel 1100 provides a rectangular space where the springs sit so that they will not fall out of the holder. Opening 1102 forms part of a rectangular space defined by machining a portion of the slot from one side of the holder. Opening 1104 forms part of a rectangular space representing a remainder of the space machined from the opposing side of the fixture to form the channel for the springs. This produces the space which retains the springs but creates an incomplete circumference. Note: more traditional methods can be used to produce the necessary space for holding the springs but this often requires the holder to be machined as two separate parts for assembly. For high vacuum purposes, screws and press-fit parts (prone to creating small gas pockets which slowly leak into chamber, also known as virtual vacuum leaks) are avoided with this monolithic fixture.

FIGS. 12A-F shows several views of a vertical sample holder. A slot 1200 is provided for inserting and holding flat substrates. Notice four slots in this holder: the design is low profile and allows for manufacturing of holders which can handle multiple samples in a row while taking up very little space. They can be machined from a single piece of metal. These can also be machined from multiple pieces of metal and assembled with screws or press-fit pieces but must be larger to accommodate screws. An opening 1202 forms part of a rectangular space for springs machined from one side.

An opening 1204 forms another part of a rectangular space for springs completed by machining from the opposing side.

FIGS. 13A-G show several views of a 45-degree angle sample holder. A slot 1300 is provided for inserting and holding flat substrates at an angle. An opening 1302 forms a part of the rectangular space for springs machined from one side. An opening 1304 a part of the rectangular space completed by machining from the opposing side.

FIGS. 14A-E show several views of cantilever springs used in sample holders of the present invention. A point 1400 of the spring is indicated where the spring makes contact with the sample during holding. A point 1402 of the surface is where the spring makes contact with the sample as it is inserted into the holder. As the sample goes deeper into the slot, the sample slides along the surface causing the spring to compress. A portion 1404 of the spring forms a side of the spring which opposes the force applied to the sample. An equal and opposite force is applied to the opposing wall of the slot by the spring to hold the sample in place.

FIGS. 15A-E shows views of a substrate cleaving device incorporating a substrate holder according to embodiments of the present invention. While these holders have been designed for high vacuum systems, the flat substrate holding method can be applied for other applications such as the substrate cleaving device shown here. A single crystal substrate (such as a silicon wafer piece) is held in place during the cleaving process for this application.

This device addresses problems with the typical cleaving process for silicon wafers used by research and failure analysis labs which includes creating a small scratch along the crystal lattice plane near the edge of the sample using a diamond scribe. Pressure is then applied on either side of the scratch and on the side directly behind the scratch (applying three points of pressure). If the substrate is a single crystal, it will ideally break preferentially along the lattice plane and cleave in a straight line from the initial scratch mark. However, when done by hand it is difficult to scratch the wafer surface in a straight line. Additionally, it is difficult to apply even pressure on either side of the scratch. This may cause the cleave to not follow a straight line.

Using the cleaving device shown, the sample is held in one position which allows a diamond scribe to be scratched in precisely the same spot with every use. This allows the fixture to apply pressure precisely opposite the scratch and evenly on either side of the scratch without movement of the sample. The diamond scribe mechanism is spring-loaded so that the scribe applies a controlled amount of pressure when contacting the substrate. From a retracted position, the scribe can be lifted and slide over the silicon and placed onto the substrate surface. The mechanism is then pulled back to a retracted position while the diamond makes contact with the silicon leaving a scratch. A lever is pushed on a second mechanism which applies pressure directly behind the scratch on the back side of the wafer. The opposing force is applied on either side of the scratch from the top of the wafer by the sample holder mechanism.

A slot 1500 is provided for inserting and holding flat substrates. Opening 1502 forms part of the rectangular space for retaining the springs machined parallel to the sample holding slot. Instead of machining from the opposing sides (parallel to the sample holding slot) to define the rectangular space for retaining the springs, the holding mechanism can be machined at two different angles. In this drawing, the slot is machined by machining the second part 1504 of the socket perpendicular to the sample holding slot. This allows for the holding design to be incorporated into complex fixtures.

FIGS. 16A-E show views of a wide spring that may extend the entire width of a groove in a sample holder. A point 1600 indicates where the spring makes contact with the sample during holding. As the sample is inserted into the slot, the sample makes contact with the spring surface at point 1602.

As the sample goes deeper into the slot, the sample slides along the surface causing the spring to compress. A portion 1604 forms a side of the spring which opposes the force applied to the sample. An equal and opposite force is applied to the opposing wall of the slot by the spring to hold the sample in place.

FIGS. 17A-E shows several views of another sample holder according to the present invention. This holder includes a sample holding mechanism built into a circular piece of metal with a threaded hole for mounting into a screw. This demonstrates that the holding mechanism can be built into a substrate suitable for the specific instrument or application. A slot 1700 is provided for inserting and holding flat substrates. Opening 1702 forms part of the rectangular space for retaining the springs machined parallel to the sample holding slot 1700. Opening 1704 forms a second part of the rectangular space and is made by machining the second part of the socket perpendicular to the sample holding slot.

The invention claimed is:

1. A holder for a flat substrate, the holder consisting of a) a monolithic fixture machined from a single piece of nonmagnetic metal and b) multiple cantilever springs composed of beryllium copper;

wherein the monolithic fixture is machined to have i) a single post for mounting the holder on a stage inside a vacuum chamber of an instrument, ii) a single groove into which the flat substrate may be inserted, and iii) a single channel for holding the multiple cantilever springs within the groove;

wherein the multiple cantilever springs are positioned in the channel for securing the flat substrate in the groove and are held in place only by their own compression against an opposing surface to the channel on an opposite side of the groove;

wherein the nonmagnetic material is brass, aluminum, titanium, stainless steel, or copper.

* * * * *